(12) United States Patent
Hayes

(10) Patent No.: US 6,278,820 B1
(45) Date of Patent: Aug. 21, 2001

(54) HIGH POWER AND LARGE BANDWIDTH TRAVELING-WAVE PHOTODETECTOR

(75) Inventor: Robert R. Hayes, Calabasas, CA (US)

(73) Assignee: The Boeing Company, Seattle, WA (US)

( * ) Notice: Subject to any disclaimer, the term of this patent is extended or adjusted under 35 U.S.C. 154(b) by 0 days.

(21) Appl. No.: 09/301,637

(22) Filed: Apr. 23, 1999

(51) Int. Cl.[7] ................ G02B 6/26; G01J 1/04; H01L 29/06

(52) U.S. Cl. ............ 385/39; 385/1; 385/2; 385/3; 385/40; 385/132; 250/227.11; 257/22; 257/21; 257/184

(58) Field of Search ................ 385/39, 40, 48, 385/50, 1, 2, 3; 250/227.11; 257/22, 21, 184

(56) References Cited

U.S. PATENT DOCUMENTS 5,270,532 * 12/1993 Hietala et al. ............... 250/214.1
6,177,686 * 1/2001 Gutierrez-Aitken ............ 257/22

* cited by examiner

*Primary Examiner*—Frank G. Font
*Assistant Examiner*—Roy M. Punnoose
(74) *Attorney, Agent, or Firm*—Terje Gudmestad

(57) ABSTRACT

A traveling-wave photodetector (10, 22, 30) having a waveguide layer (12) separated, such as by an intermediate layer (24), from an absorbing layer (14). Absorbed power is spread out, minimizing thermal heating of the photodetector (10, 22, 30). Light travels through a weakly absorbing optical waveguide (12) and the electrical current generated by the absorbed light is collected by electrodes (18, 36). The juxtaposition of the waveguide layer (12) and the absorbing layer (14) eliminates electron and hole trapping allowing high-power and large bandwidth operation of the traveling-wave photodetector (10, 22, 30).

13 Claims, 2 Drawing Sheets

HIGH POWER AND LARGE BANDWIDTH TRAVELING-WAVE PHOTODETECTOR

TECHNICAL FIELD

The present invention relates to a traveling-wave photodetector and more particularly to a traveling-wave photodetector having high power operation and large bandwidth.

BACKGROUND ART

Photodetectors convert modulated light into electrical signals. Photodetectors are used in many areas including, but not limited to, antenna remoting, spacecraft RF interconnects, analog and digital links, and other applications using a fiber optic link having a high spur-free dynamic range.

Solid state photodetectors typically operate by incident light or photons being absorbed to create electrons and holes, known as carriers. A device such as a p-i-n (PIN) diode sweeps away the carriers to electrical contacts to produce a photocurrent. A PIN diode is formed when p-type and n-type semiconductor regions are separated by a layer of intrinsic semiconductor material.

An example of a prior art surface coupled PIN photodetector 100 is shown in FIG. 1. The goal in a surface coupled PIN is to absorb as much of the light in as short a distance as possible. The entire absorbing region is made from a narrow-bandgap material, which is covered with highly doped material, forming ohmic junctions that are transparent to both electrons and holes.

Conventional surface-coupled PIN photodetectors have a small surface area and a large bandwidth, but are limited in the amount of optical power they can absorb. Excessive power may damage the photodetector, and produces saturation effects that reduce performance. It is possible, by making the surface area of the device larger, so that the optical power can be spread out over a large area, to reduce the damage and increase the saturation threshold. However, this reduces the RF bandwidth of the device by the corresponding increase in capacitance. A simple PIN photodetector is not capable of unlimited high-power operation and large bandwidth.

Presently, a traveling-wave photodetector 200 having a larger surface area is known in the prior art and is shown in FIG. 2. The photodetector 200 has a thin absorbing layer 202 to achieve low absorption per unit length. The layer 202 is positioned between two non-absorbing layers 204. However, the thin absorbing layer has a significant drawback. The electron-hole pairs that are generated within the layers become trapped and can only leave the layers by way of a thermal process. The thermal process is inherently slow, which means that any photodetector made using thin layers will have an upper frequency response that cannot exceed a few Gigahertz. It has been suggested to use compositional grading. While this process alleviates the trapping problem, it does not eliminate it.

SUMMARY OF THE INVENTION

The traveling-wave photodetector of the present invention has high-power operation and large bandwidth. The present invention is a traveling-wave photodetector having an epitaxial layer structure that spreads out the absorbed power, minimizing the thermal heating of the device. The present invention operates such that light travels through an optical waveguide that is weakly absorbing, and in which electrical current generated by the absorbed light is collected by electrodes that are attached to the waveguide. The power absorption is spread out over a large area, while the intrinsic bandwidth of the absorbing structure is maintained. The problem of slow thermal processes is avoided and the frequency response is limited only by the transit time of the detector. Devices with responses well in excess of 100 GHz may be possible.

The present invention allows for a high-speed PIN photodetector to be fabricated by proven techniques, and combines the PIN structure with a separate non-absorbing waveguide structure in a manner that allows light from the waveguide to slowly leak into the absorbing PIN structure as light propagates along the waveguide. This greatly reduces the effective absorption per unit length of the photodetector, without compromising the performance of the detector. Spreading out the absorbed light reduces thermal heating and saturation effects. The traveling wave electrode structure for the PIN photodiode eliminates frequency degradation effects due to detector capacitance.

It is an object of the present invention to overcome the drawbacks associated with photodetectors having thin layers. It is another object of the present invention to provide high-power, large bandwidth operation of a traveling-wave photodetector.

It is a further object of the present invention to provide a traveling-wave photodetector that has an epitaxial layer structure that spreads out absorbed power and minimizes thermal heating. It is yet a further object of the present invention to have light travel through an optical waveguide that is weakly absorbing. It is still a further object of the present invention to collect the electrical current absorbed by the light at electrodes attached to the waveguide.

Other objects and features of the present invention will become apparent when viewed in light of the detailed description of the preferred embodiment when taken in conjunction with the attached drawings and appended claims.

BEST MODE(S) FOR CARRYING OUT THE INVENTION

Figure 3:
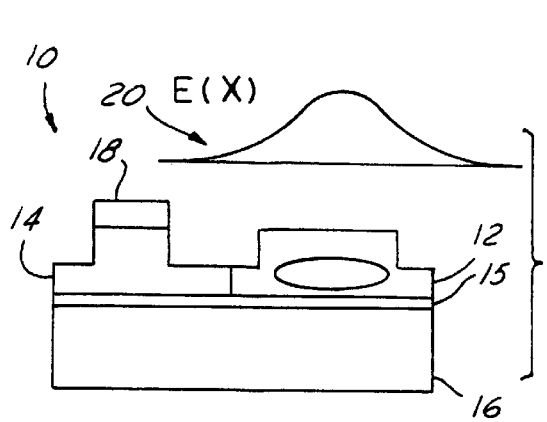
FIG. 3 is a cross section of one embodiment of the traveling-wave photodetectors of the present invention.
Figure 4:
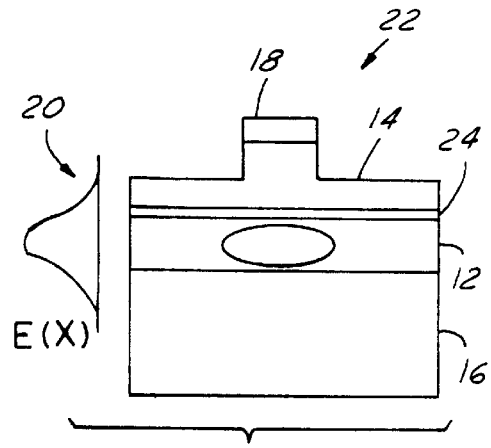
FIG. 4 is a cross section of another embodiment of the traveling-wave photodetector of the present invention.
Figure 5:
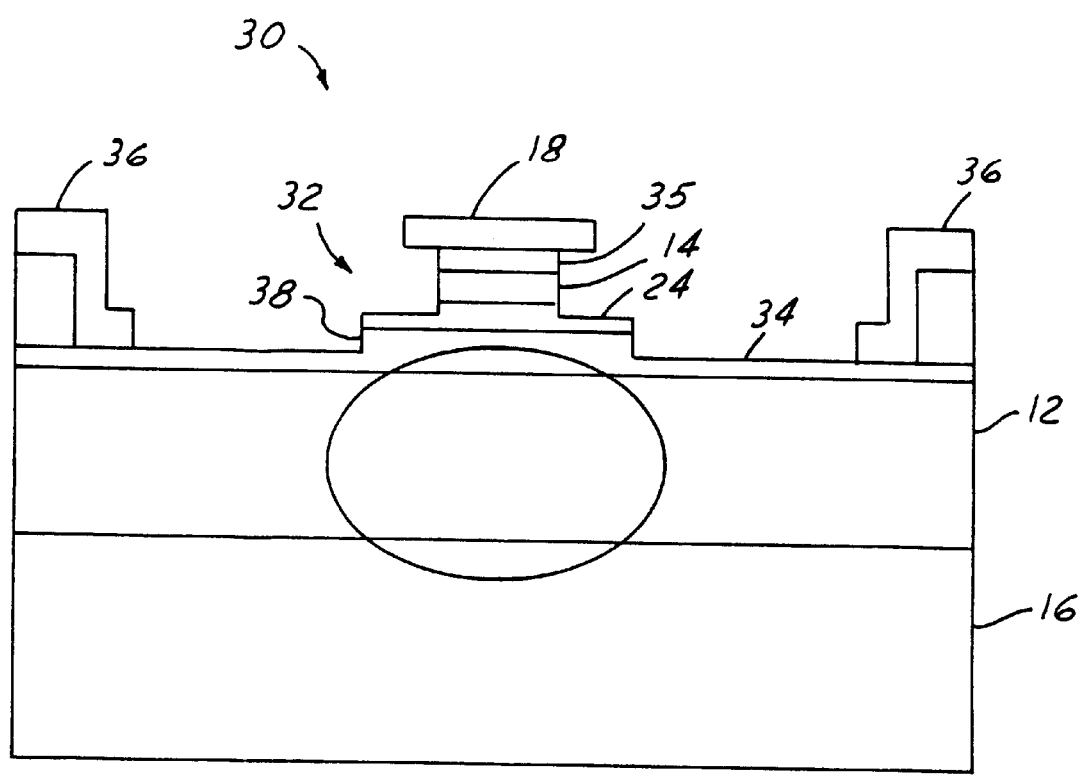
FIG. 5 is a cross section of yet another embodiment of the photodetector of the present invention which incorporates separate absorbing and waveguiding regions.

The high power traveling-wave photodetector of the present invention is shown generally in FIGS. 3 through 5. Generally, the photodetector of the present invention has a separate light propagating, or waveguide, region 12 and a light absorbing region 14 that together achieve a low absorption per unit length enabling high power operation and large bandwidth operation.

Referring to FIG. 3 there is shown a cross section of one embodiment of the photodetector 10 of the present invention. The waveguide region 12 is horizontally separated from the absorbing region 14. In the embodiment shown in FIG. 3, both regions 12 and 14 are located on a highly doped conductive layer 15 that serves as a bottom electrode. Voltages of opposite polarity are applied to the top and bottom electrodes. This sets up an electric field that sweeps out the photogenerated carriers, which are then collected by the electrodes. All of the layers 12, 14, and 15 are located on a substrate 16 that is typically made of a semi-insulating material.

The optical electric field E(x) is shown in relation to the traveling-wave photodetector 10. only a small fraction 20 of the optical field E(x) is actually in the absorbing region 14. Therefore, although the absorption coefficient of the material is approximately 10,000 $cm^{-1}$, the effective absorption constant is much less, i.e., on the order of 10–100 $cm^{-1}$. Light energy is drawn slowly out of the waveguide region 12 as the optical wave, shown by the ellipse, propagates along the traveling-wave photodetector 10. The ellipse shows the approximate size and shape of the optical beam.

The structure of the photodetector 10 in FIG. 3 requires a growth and re-growth process to juxtaposition the absorbing material in the absorbing region 12 with the non-absorbing materials.

FIG. 4 is a cross section of another embodiment 22 in which the regions 12 and 14 are separated vertically from each other on substrate 16. In this embodiment, the materials are grown one on top of the other, which is a standard procedure for Metal Organic Chemical Vapor Deposition (MOCVD), Metal Organic Vapor Phase Epitaxy (MOVPE), and Molecular Beam Epitaxy (MBE) growth processes. The non-absorbing waveguiding region 12 is grown first and the absorbing region 14 is grown on top of the waveguiding region 12.

A thin intermediate layer 24 is shown in FIG. 4. The intermediate layer has two functions. First, it is heavily doped so that it is conductive, and serves as a bottom electrode. In addition, the intermediate layer 24 has an index of refraction that may be adjusted to either increase or decrease the coupling per unit length into the absorbing region. The concept of inserting an impedance-matching layer for short detectors is discussed by R. J. Deri and O. Wada in an article titled "Impedance Matching for Enhanced Waveguide/Photodetector Integration", App. Phys. Lett., Vol. 55, pp. 2712–2714 (1989).

FIG. 5 is a cross section of another embodiment of a photodetector 30 in accordance with the present invention. The photodetector 30 has a large optical waveguide region 12. The materials and dimensions of the layers and regions are chosen to match the velocity of the forward-propagating microwave field on the electrodes 18 and 36 to the velocity of the light wave in the waveguide region 12. A rib structure 32 of the photodetector 30 is made small in order to achieve a 50 Ω impedance for the traveling wave structure, and to facilitate the velocity match.

A $p^+$ layer 35 is located beneath electrode 18. A heavily doped $n^+$ layer 34 acts as a ground plane for the electric field, E(x), yet allows a magnetic field to circle around the center electrode 18. The center electrode 18 and two adjacent ground plane electrodes 36 form a microwave coplanar waveguide (CPW) structure, which guides the microwave field along the traveling-wave structure 32.

The width of the optical mode is determined by a ridge 38 in the n+layer 34. The intermediate layer 24 is a thin layer of material that may be used to either increase or decrease the coupling into the absorbing region and is also doped $n^+$. Layer 35 along with layers 24 and 34 constitute the top and bottom electrodes that bound the intrinsic absorbing region 14.

Figure 1:
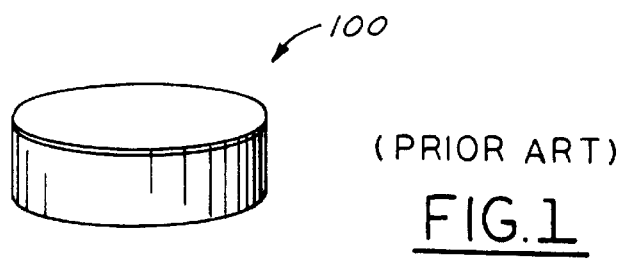
FIG. 1 is a perspective view of a prior art surface-coupled PIN photodetector.
Figure 2:
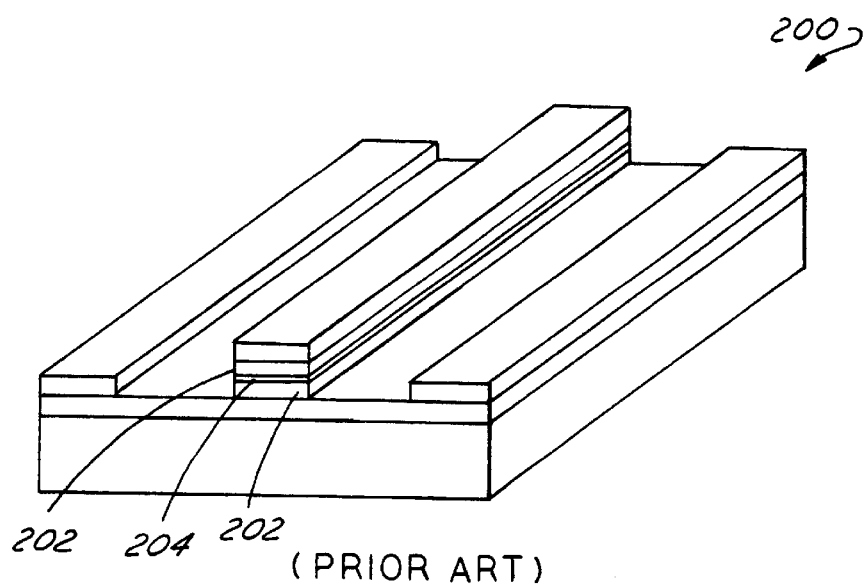
FIG. 2 is a perspective view of a prior art edge-coupled traveling-wave photodetector.

A particular advantage to the traveling wave photodetector of the present invention is that the trapping effects associated with prior art photodetectors are eliminated. The prior art photodetector shown in FIG. 2 has a thin narrow bandgap absorbing layer 202 sandwiched between two non-absorbing layers 204. This sandwiching between two layers having a larger bandgap forms a potential well in the absorbing material that traps carriers. In the present invention, the narrow bandgap absorbing region is sandwiched between highly doped layers that are totally transparent to current flow, thereby completely eliminating trapping effects.

Another advantage of the present invention is that the absorption per unit length of the photodetector can be adjusted through proper design and material selection. The thin absorbing layer 202 (on the order of 100 Å) in the prior art is not easily modified without adversely affecting the growth process used in its manufacture. The thicker layers used in the present invention easily facilitate dimensional adjustments that are difficult to achieve in the prior art device.

In operation, the photodetector is typically used in conjunction with a fiber optic link. Again, the size and dimensions for the waveguide region 12 of the photodetector of the present invention can be easily tailored to optimally match the mode profile of the fiber to which the photodetector is ultimately attached. The result is a maximization of the transfer of energy from the fiber to the detector.

Yet another advantage is that the width and thickness of the absorbing region 14 can be easily adjusted to optimize the RF propagation properties of the photodetector's traveling-wave electrodes 18, without regard for the optical waveguiding properties.

The present invention can be fabricated using proven techniques. The PIN photodetector structure and separate nonabsorbing waveguide structure are combined such that light from the waveguide leaks slowly into the absorbing PIN as the light wave propagates along the waveguide structure. The effective absorption is reduced per unit length, thereby spreading out the absorption of light along the length of the PIN photodetector, without compromising the performance of the PIN detector.

While particular embodiments of the invention have been shown and described, numerous variations and alternate embodiments will occur to those skilled in the art. Accordingly, it is intended that the invention be limited only in terms of the appended claims.

What is claimed is:

1. A traveling-wave photodetector including:

a substrate;

a light propagation medium located on said substrate;

a light absorbing medium located on said substrate and separated from said light propagation medium, said light absorbing medium having a predetermined length, width and thickness, said light absorbing medium for absorbing an electrical signal generated by light propagating through said photodetector; and at least one electrode located on said light absorbing medium for transmitting said electrical signal.

2. The traveling-wave photodetector as claimed in claim 1 wherein said light propagation medium and said light absorbing medium are separated horizontally.

3. The traveling-wave photodetector as claimed in claim 1 wherein said light propagation medium and said light absorbing medium are separated vertically.

4. The traveling-wave photodetector as claimed in claim 3 wherein said light propagation medium and said light absorbing medium are separated by an intermediate layer.

5. The traveling-wave photodetector as claimed in claim 4 wherein said intermediate layer further comprises a layer of material having an index of refraction that is intermediate between that of said light propagating medium and said light absorbing medium.

6. The traveling-wave photodetector as claimed in claim 5 wherein said intermediate layer further comprises an intermediate layer having a thickness that is adjusted to alter coupling with said light absorbing medium.

7. The traveling-wave photodetector as claimed in claim 1 wherein said light absorbing medium has a predetermined thickness and width for optimizing RF propagation properties of said at least one electrode.

8. The traveling-wave photodetector as claimed in claim 1 wherein said light propagating medium and said light absorbing medium are selected such that a predetermined absorption per unit length is defined.

9. A traveling-wave photodetector including:

a substrate;

an optical waveguiding layer located on said substrate;

a heavily doped $n^+$ layer located above said optical waveguiding layer;

an absorbing layer located above said heavily doped $n^+$ layer;

a $p^+$ layer located above said absorbing layer;

an electrode located above said absorbing layer;

whereby said optical waveguiding layer and said absorbing layer are sufficiently separated from each other so that light energy is drawn slowly out of said optical waveguiding layer as an optical wave propagates through said photodetector.

10. The traveling-wave photodetector as claimed in claim 9 further comprising an intermediate layer located between said $n^+$ layer and said absorbing layer.

11. The traveling-wave photodetector as claimed in claim 9 wherein said $n^+$ layer has a ridge having a predetermined width for determining a width of an optical mode.

12. The traveling-wave photodetector as claimed in claim 9 further comprising two electrodes adjacent said at least one electrode, said electrodes defining a microwave coplanar waveguide structure for guiding a microwave field along said traveling wave structure.

13. The traveling-wave photodetector as claimed in claim 9 wherein said absorbing layer has a predetermined thickness and width such that RF propagation properties of said electrodes are optimized.

* * * * *